United States Patent
Schäfer et al.

(10) Patent No.: US 10,785,877 B2
(45) Date of Patent: Sep. 22, 2020

(54) METHOD FOR PRODUCING A SILVER SINTERING AGENT HAVING SILVER OXIDE SURFACES AND USE OF SAID AGENT IN METHODS FOR JOINING COMPONENTS BY PRESSURE SINTERING

(71) Applicant: Heraeus Deutschland GmbH & Co. KG, Hanau (DE)

(72) Inventors: Michael Schäfer, Künzell (DE); Wolfgang Schmitt, Rodgau (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 377 days.

(21) Appl. No.: 15/329,768

(22) PCT Filed: Apr. 17, 2015

(86) PCT No.: PCT/EP2015/058441
§ 371 (c)(1),
(2) Date: Jan. 27, 2017

(87) PCT Pub. No.: WO2016/015880
PCT Pub. Date: Feb. 4, 2016

(65) Prior Publication Data
US 2017/0223840 A1    Aug. 3, 2017

(30) Foreign Application Priority Data
Jul. 28, 2014   (EP) .................................... 14178758

(51) Int. Cl.
| H05K 3/32 | (2006.01) |
| H01L 23/00 | (2006.01) |
| B22F 7/04 | (2006.01) |
| B22F 5/00 | (2006.01) |
| B22F 3/10 | (2006.01) |
| B22F 3/14 | (2006.01) |
| B23K 35/02 | (2006.01) |
| B23K 35/30 | (2006.01) |
| C23C 8/10 | (2006.01) |
| C25D 11/34 | (2006.01) |
| H05K 1/09 | (2006.01) |

(52) U.S. Cl.
CPC .............. *H05K 3/321* (2013.01); *B22F 3/10* (2013.01); *B22F 3/14* (2013.01); *B22F 5/00* (2013.01); *B22F 5/006* (2013.01); *B22F 7/04* (2013.01); *B23K 35/0244* (2013.01); *B23K 35/3006* (2013.01); *C23C 8/10* (2013.01); *C25D 11/34* (2013.01); *H01L 24/27* (2013.01); *H01L 24/29* (2013.01); *H01L 24/83* (2013.01); *B22F 2301/255* (2013.01); *B22F 2998/10* (2013.01); *H01L 24/32* (2013.01); *H01L 2224/0345* (2013.01); *H01L 2224/03462* (2013.01); *H01L 2224/03505* (2013.01); *H01L 2224/04026* (2013.01); *H01L 2224/05639* (2013.01); *H01L 2224/05687* (2013.01); *H01L 2224/271* (2013.01); *H01L 2224/2712* (2013.01); *H01L 2224/2908* (2013.01); *H01L 2224/2939* (2013.01); *H01L 2224/29083* (2013.01); *H01L 2224/29187* (2013.01); *H01L 2224/29239* (2013.01); *H01L 2224/29295* (2013.01); *H01L 2224/29339* (2013.01); *H01L 2224/29395* (2013.01); *H01L 2224/32145* (2013.01); *H01L 2224/32225* (2013.01); *H01L 2224/32245* (2013.01); *H01L 2224/32265* (2013.01); *H01L 2224/83055* (2013.01); *H01L 2224/83065* (2013.01); *H01L 2224/83075* (2013.01); *H01L 2224/8384* (2013.01); *H01L 2224/83101* (2013.01); *H01L 2224/83203* (2013.01); *H01L 2224/83439* (2013.01); *H01L 2224/83444* (2013.01); *H01L 2924/13055* (2013.01); *H01L 2924/13091* (2013.01); *H05K 1/092* (2013.01); *H05K 3/32* (2013.01)

(58) Field of Classification Search
CPC .............. B22F 3/10; B22F 3/14; H05K 3/321
USPC .............................................................. 419/1
See application file for complete search history.

(56) References Cited

U.S. PATENT DOCUMENTS

| 8,592,996 B2 | 11/2013 | Morita et al. | |
| 8,925,789 B2 * | 1/2015 | Schafer ................. | B22F 1/0062 |
| | | | 148/23 |
| 2008/0160183 A1 | 7/2008 | Ide et al. | |
| 2010/0195292 A1 | 8/2010 | Ide et al. | |
| 2011/0147938 A1 | 6/2011 | Kang | |

FOREIGN PATENT DOCUMENTS

| CN | 101160417 A | 4/2008 |
| CN | 101506994 A | 8/2009 |
| CN | 102292835 A | 12/2011 |
| CN | 102386149 A | 3/2012 |
| CN | 102510783 A | 6/2012 |
| CN | 103733277 A | 4/2014 |

(Continued)

OTHER PUBLICATIONS

Office Action dated Nov. 13, 2018 in CN Application No. 201580040033.1.

(Continued)

*Primary Examiner* — Weiping Zhu
(74) *Attorney, Agent, or Firm* — Panitch Schwarze Belisario & Nadel LLP

(57) ABSTRACT

A method for the production of a silver sintering agent in the form of a layer-shaped silver sintering body having silver oxide surfaces and the use thereof are provided.

7 Claims, No Drawings

(56) References Cited

FOREIGN PATENT DOCUMENTS

| EP | 0579911 A2 | 1/1994 |
| EP | 2425920 A1 | 3/2012 |
| EP | 2428293 A2 | 3/2012 |
| EP | 2572814 A1 | 3/2013 |
| JP | S5811705 A | 1/1983 |
| WO | 2006109956 A1 | 10/2006 |
| WO | 2011026623 A1 | 3/2011 |

OTHER PUBLICATIONS

Int'l Search Report dated Jul. 17, 2015 in Int'l Application No. PCT/EP2015/058441.
Int'l Preliminary Report on Patentability dated Jan. 31, 2017 in Int'l Application No. PCT/EP2015/058441.
Written Opinion dated Jul. 17, 2015 in Int'l Application No. PCT/EP2015/058441.
Siow et al, "Are Sintered Silver Joints Ready for Use as Interconnect Material in Microelectronic Packaging," Journal Electronic Materials, vol. 43, No. 4, pp. 947-961 (2014).
Office Action dated Feb. 7, 2018 in CN Application No. 201580040033.1.
Office Action dated May 17, 2018 in CN Application No. 20158004033.1 (English translation only).
Office Action dated Nov. 11, 2019 in EP Application No. 15716083.9.

\* cited by examiner

METHOD FOR PRODUCING A SILVER SINTERING AGENT HAVING SILVER OXIDE SURFACES AND USE OF SAID AGENT IN METHODS FOR JOINING COMPONENTS BY PRESSURE SINTERING

CROSS-REFERENCE TO RELATED APPLICATIONS

This application is a Section 371 of international Application No. PCT/EP2015/058441, filed Apr. 17, 2015, which was published in the German language on Feb. 4, 2016 under International Publication No. WO 2016/015580 A1 and the disclosure of Which is incorporated herein by reference.

BACKGROUND OF THE INVENTION

The invention relates to a method for the production of a silver sintering agent having silver oxide surfaces, and the use thereof in methods for the connection of components by means of pressure sintering.

US 2010/0195292 A1 discloses electronic components having a silver electrode that is provided with an external silver oxide layer. The silver oxide layer can be used for direct connection by sintering of the electronic component to a surface to be connected to it, whereby the silver oxide is reduced to silver.

US 2008/160183 A1 discloses a sintered connection method, in which a composition that can be sintered into a conductive layer and comprises organically-coated silver particles and silver oxide particles is used to produce a snuffed connection between surfaces that are to be connected. The still sinterable composition can be present in the application form of an ink, a paste or a sintering preform in the form of a layer-shaped pellet.

EP 0 579 911 A2 discloses a method for producing slurry-cast isotropic composite materials based on copper. In this context, a mixed slurry is cast onto a suitable substrate, fired, sintered, and processed through cold-rolling and tempering steps into a massive band. The composite materials can be used for the manufacture of electronic components.

The use of metal and/or silver sintering pastes or sinterable sinter preforms, produced from them by application and drying, for attachment and electrical contacting of and for heat dissipation from electronic components, such as, for example, semi-conductor chips, is known in the electronics industry. Accordingly, said metal and/or silver sintering pastes and silver preforms were described, for example, on Jan. 217, 014 in the online publication "Are Sintered Silver Joints Ready for Use as interconnect Material in Microelectronic Packaging?" authored by KIM S. SIOW in the journal of ELECTRONIC MATERIALS (DOI: 1.0.1007/s11664-013-2967-3). Examples of patent literature on metal and/or silver sintering pastes include WO2011/026623A1, EP2425920A1, EP2428293A1, and EP2572814A1. Usually, said metal and/or silver sintering pastes are applied by printing, for example screen or stencil printing, onto support substrates, dried if needed, configured with electronic components, and then subjected to a sintering process. Without transitioning through the liquid state, the metal and/or silver particles become connected by diffusion during the sintering process while forming a solid, electrical current- and heat-conducting metallic and/or silver connection between substrate and electronic component.

However, as the applicant was able to ascertain, an attachment between components while forming a sintered connection can also be attained without, or without direct use of, a metal and/or silver sintering paste. Surprisingly, a silver sintering agent in the form of a layer-shaped silver sintering body having silver oxide surfaces that is produced according to the inventive method illustrated below can be used instead of a metal and/or silver sintering paste.

BRIEF SUMMARY OF THE INVENTION

The silver sintering agent produced according to the inventive method is a layer-shaped silver sintering body having silver oxide surfaces, i.e., having a total surface or multiple discrete surfaces, each in the form of a silver oxide layer. Accordingly, the silver sintering agent is a discrete layer-shaped silver sintering body that is present freely and/or as a single separate part, i.e. a discrete and/or free sintered silver layer comprising said silver oxide surfaces. The thickness or layer thickness of the layer-shaped silver sintering body is in the range of, for example, 10 to 300 µm.

DETAILED DESCRIPTION OF THE INVENTION

As mentioned above, the silver sintering agent produced according to the inventive method is a layer-shaped silver sintering body. i.e., a sintered silver structure in the form of a layer, in other words, a silver structure that cannot be sintered any longer as such. A sintered silver structure of this type comprises, in particular, no silver oxide, i.e., no silver oxide in its mass, other than the external silver oxide surfaces mentioned above. A layer-shaped silver sintering body of this type shall, not be mistaken for one of the still sinterable sintering preforms mentioned above.

The metal oxide and silver oxide surfaces or metal oxide and silver oxide layers mentioned herein each are external or outward-facing metal oxide and silver oxide surfaces and/or metal oxide and silver oxide layers. Referring to the sintering agent, this can also concern, in particular, a silver oxide surface or silver oxide layer that covers the entire external surface thereof and therefore is outward-facing.

The silver of the silver sintering agent can be pure silver or a silver alloy. The alloys comprise, for example, a fraction of >50 wt % silver.

The silver sintering agent in the shape of a layer-shaped silver sintering body having silver oxide surfaces (for short also referred to as "silver Sintering agent" or "layer-shaped silver sintering agent" hereinafter) can be produced according to the inventive method by (1) application, for example, by screen printing, stencil printing or spray application, from a silver sintering preparation onto a support substrate having a surface that is incapable of forming a sintered connection, (2) subsequent sintering of the silver sintering preparation thus applied while applying, or preferably not applying, mechanical pressure, followed by (3) detaching the layer-shaped silver sintering body thus formed from the surface of the support substrate. If no or only an insufficient silver oxide layer is generated on the surface of the layer-shaped silver sintering body after this sequence of production steps, for example by atmospheric oxidation, (4) a downstream oxidation step can be added for the purpose of producing or reinforcing a silver oxide layer on the entire external surface or on parts of the external surface of the layer-shaped silver sintering body. Oxidation processes as illustrated below can be used in this context.

Accordingly, the method according to the invention for the production of a silver sintering agent in the form of a layer-shaped silver sintering body having silver oxide surfaces comprises the steps of:
(1) applying a silver sintering preparation onto a support substrate having a surface that is incapable of forming a sintered connection;
(2) sintering the applied silver sintering preparation;
(3) detaching the layer-shaped silver sintering body formed in step (2) from the surface of the support substrate; and
(4) optionally producing or reinforcing a silver oxide layer on all or part of the external surface of the layer-shaped silver sintering body by an oxidation step after step (3).

The silver sintering pastes mentioned above are examples of silver sintering preparations that can be used in the production of a layer-shaped silver sintering body of this type.

Suitable support substrates having a surface that is incapable of forming a sintered connection for use in the production of the layer-shaped silver sintering bodies include, for example, aluminum oxide ceramics, nickel foils, polyimide films, polytetrafluoroethylene films, and silicone films. It is obvious to a person skilled in the art to select planar support substrates having a non-porous and sufficiently smooth surface in this context—regardless of the selection of material.

The application of the silver sintering preparation, for example screen printing, stencil printing or spray application, as well as the procedure of sintering, are well-known to a person skilled in the art and there are no method-related particularities such that a detailed description is not required and reference shall be made in this context, for exemplary purposes, to the literature cited above. Likewise, the detachment from the support substrate having a surface that is incapable of forming a sintered connection bears no difficulty since the layer-shaped silver sintering body thus formed basically detaches by itself during the sintering process.

The silver sintering agent can be produced in the format desired by the user, for example, an operator of a method for the connection of components by pressure sintering, such that no waste arises in the form of clippings at the premises of the operator. It can also be expedient to produce the silver sintering agent as endless ware and to deliver it to the user, for example, still situated on the support substrate or already detached from the support substrate. Endless ware can be provided with pre-determined breakage sites, for example with perforations, to be easy and according to specifications to use by the user. In the case of endless ware, reeled goods are the preferred delivery form.

In any case, the silver sintering agent comprises the silver oxide surfaces, which can each form a joint contact surface with the metallic contact surfaces of the components. In this context, the silver oxide surfaces that are capable of forming joint contact surfaces with the metallic contact surfaces of the components can be present as discrete silver oxide surfaces, i.e., delimited from each other.

However, they can just as well be present in the form of a continuous silver oxide layer covering part or all of the surface of the silver sintering agent.

The silver oxide surfaces of the silver sintering agent are preferably situated on the front and rear side thereof such that the arrangement produced upon the use thereof in a method for the connection of components by pressure sintering has a sandwich structure, i.e., the components of an arrangement of the components with silver sintering agent arranged in between are then situated on opposite sides of the silver sintering agent.

The external or outward-facing silver oxide layer is firmly connected to the silver situated underneath. The silver oxide layer can be, for example, 0.02 to 6 µm in thickness. It can be formed by oxidation upon contact with air or it can be produced or reinforced chemically by oxidation agents or by anodic oxidation of the silver surface that is not, not yet, only little or more or less oxidized. As indicated in the preceding sentence, a pre-existing thin layer of silver oxide can be generated or reinforced, for example, by anodic oxidation. For example, a non-oxidized, partly-oxidized or initially-oxidized silver surface can be oxidized by anodic oxidation up to the formation of a silver oxide layer that is, for example, 0.03 to 5 µm thick. Referring to a silver surface, a silver oxide layer with a layer thickness of, for example, 0.05 to 1 µm, can be formed by anodic oxidation.

The anodic oxidation can be implemented, for example, by immersing the silver sintering agent, arranged as anode and to be oxidized on its surface, in a suitable aqueous electrolyte solution. Suitable aqueous electrolyte solutions include, for example, 5 to 10 wt. % aqueous solutions of sodium carbonate, sodium hydrogen carbonate, potassium hydroxide or sodium hydroxide. The anodic oxidation can take place, for example, for 5 to 30 seconds at a direct voltage in the range of 5 to 20 volts.

The invention also relates to the use of a silver sintering agent produced according to the inventive method in a method for the connection of components, in which an arrangement of at least two components each comprising at least one metallic contact surface and the silver sintering agent arranged between the components is provided and the arrangement is pressure sintered, whereby silver oxide surfaces of the silver sintering agent and the metallic contact surfaces of the components each form a joint contact surface, and wherein (I) the pressure sintering is carried out in an atmosphere containing at least one oxidizable compound and/or (II) the silver oxide surfaces are provided with at least one oxidizable organic compound before formation of the corresponding joint contact surface.

The wording used herein "whereby silver oxide surfaces of the silver sintering agent and the metallic contact surfaces of the components form a joint contact surface each" is explicitly meant to include those cases in which only surface fractions of the silver oxide surfaces of the silver sintering agent and the metallic contact surfaces of the components form a joint contact surface.

Accordingly, embodiment (I) of the method comprises the steps of:
(i) providing at least two components, each with a metallic contact surface, and the silver sintering agent in the form of the layer-shaped silver sintering body having silver oxide surfaces;
(ii) providing an arrangement of the at least two components and the silver sintering agent arranged in between them while forming joint contact surfaces from the respective silver oxide surface of the silver sintering agent and the metallic contact surface of the corresponding component; and
(iii) pressure sintering of the arrangement in an atmosphere that contains at least one oxidizable compound.

In contrast, embodiment (II) of the method comprises the steps of:
  (i) providing at least two components, each with a metallic contact surface, and the silver sintering agent in the form of the layer-shaped silver sintering body having silver oxide surfaces;
  (ii) providing the silver oxide surfaces with at least one oxidizable organic compound;
  (iii) providing an arrangement of the at least two components and the silver sintering agent arranged in between them while forming joint contact surfaces from the corresponding silver oxide surface of the silver sintering agent, which is provided with the at least one oxidizable organic compound, and the metallic contact surface of the corresponding component; and
  (iv) pressure sintering the arrangement.

It is feasible to combine embodiments (I) and (II).

In both embodiments (I) and (II) of the method, at least two components are being connected. In this context, an arrangement of at least two components, which each comprise a metallic contact surface, and silver sintering agent arranged between the components in the form of the layer-shaped silver sintering body having silver oxide surfaces is provided, and said arrangement is sintered in common manner known to a person skilled in the art by applying mechanical pressure and elevated temperature.

Connecting at least two components shall be understood to mean attaching a first component on a second component. In the scope of the present invention "on" shall be understood to simply mean that a metallic contact surface of the first component is being connected to a metallic contact surface of the second component by the silver sintering agent, whereby the relative position of the components or of the arrangement comprising the components is irrelevant.

In the scope of the invention, the term "component" preferably comprises single parts. Preferably, the single parts cannot be disassembled further.

According to specific embodiments, the term "components" refers to parts that are used in electronics. Accordingly, the components can be, for example, active components (e.g., semi-conductor chips, such as LEDs, diodes, IGBTs, thyristors, MOSFETs, transistors, ICs), passive components (e.g. DCBs, leadframes, resistors, capacitors, coils, inductors, memristors, clips, cooling bodies), piezo-ceramics, and Peltier elements.

The components to be connected can be identical or different components.

The components each have one metallic contact surface, whereby the metal of the metallic contact surface can be a pure metal or a metal alloy. The alloys comprise, for example, a fraction of >50 wt. % of the respective metal.

The metals of the metallic contact surfaces of the components to be connected can be identical or different. Preferably, they are selected from the group consisting of silver, copper, palladium, and alloys of these metals. Silver and silver alloys are particularly preferred as metal of the metallic contact surfaces.

The component or components can consist of metal or their metallic contact surface can be present, for example, in the form of a metallization. This can concern a metallization that is produced, for example, by vapor deposition, chemical galvanization, electroplating or application from a metal sintering preparation and subsequent sintering. The metal and/or silver sintering pastes mentioned above are examples of metal sintering preparations.

In the case of a component that does not consist of this metal, the metallic contact surface can be 100 nm to 200 µm in thickness.

Like the silver sintering agent, the metallic contact surfaces of one component or of all components to be connected can also comprise a metal oxide layer. The metal oxide of the metal oxide layer can be, in particular, an oxide of the metal of the corresponding metallic contact surface.

The components are connected to each other by pressure sintering by the silver sintering agent arranged between them, i.e., the components and the silver sintering agent situated between them are connected to each other by heating and by applying mechanical pressure without the metals of the metallic contact surfaces of the components and of the silver of the silver sintering agent transitioning into the liquid phase.

In embodiment (I) of the method, the pressure sintering takes place in an atmosphere that contains at least one oxidizable compound. Examples of suitable oxidizable compounds include carbon monoxide, hydrogen, and formic acid. The atmosphere can consist of the at least one oxidizable and gaseous compound or it can contain the latter in combination with inert gases such as, in particular, nitrogen and/or argon. Preferably, the fraction of oxidizable compounds in the atmosphere is 1 to 30 vol. %.

In embodiment (II) of the method, the silver oxide surfaces of the silver sintering agent and—if the metallic contact surface of at least one of the at least two components comprises a metal oxide layer—preferably the latter as well is/are being provided with at least one, i.e., with one or a mixture of two or more, oxidizable organic compounds, before forming the joint contact surface.

The oxidizable organic compounds preferably comprise 1 to 50, more preferably 2 to 24, even more preferably 6 to 24, and yet more preferably 8 to 20 carbon atoms and have at least one functional group.

It is preferable to use free fatty acids, fatty acid salts or fatty acid esters as oxidizable organic compounds. The free fatty acids, fatty acid salts, and fatty acid esters preferably are non-branched. Moreover, the free fatty acids, fatty acid salts, and fatty acid esters are preferably saturated.

Preferred fatty acid salts include the ammonium, monoalkylammonium, dialkylammonium, trialkylammonium, aluminum, copper, lithium, sodium, and potassium salts.

Alkyl esters, in particular methyl esters, ethyl esters, propyl esters, and butyl esters, are preferred esters.

According to a preferred embodiment, the free fatty acids, fatty acid salts or fatty acid esters are compounds with 8 to 24, more preferably 8 to 18, carbon atoms.

Preferred oxidizable organic compounds include caprylic acid (octanoic acid), capric acid (decanoic acid), lauric acid (dodecanoic acid), myristic acid (tetradecanoic acid), palmitic acid (hexadecanoic acid), niargaric acid (heptadecanoic acid), stearic acid (octadecanoic acid), arachinic acid (eicosanoic acid/icosanoic acid), behenic acid (docosanoic acid), lignoceric acid (tetracosanoic acid) as well as the corresponding esters and salts.

Particularly preferred oxizable organic compounds include dodecanoic acid, octadecanoic acid, aluminum stearate, copper stearate, sodium stearate, potassium stearate, sodium palmitate, and potassium palmitate.

In order to provide the corresponding metal oxide land/or silver oxide layer with the at least one oxidizable organic compound, the latter can, for example, be applied to the surface of the metal oxide and/or silver oxide layer as the effective substance without diluting or can be applied from an aqueous preparation or from a preparation in an organic solvent, followed by drying, for example at an object temperature of 15 to 50° C. for a drying period of 10 to 60 minutes. In terms of the mode of application, there is basically no restriction; for example, the metal oxide and/or silver oxide layer can be dipped into the preparation of the at least one oxidizable organic compound or the preparation of the at least one oxidizable organic compound can be sprayed or painted onto the metal oxide and/or silver oxide layer. The aqueous preparation or the organic solvent-based preparation can be, for example, a 1 to 20 wt. % solution, dispersion or suspension of the at least one oxidizable organic compound.

The ratio of the mass of the at least one oxidizable organic compound to the surface area of the silver oxide layer to be provided or provided with the at least one oxidizable organic compound is, for example, 0.0005 to 10 g of the at least one oxidizable organic compound per square-meter of silver oxide surface. A person skilled in the art will select this ratio based on the thickness of the silver oxide layer, i.e., the higher the thickness of the silver oxide layer, the higher the person skilled in the art will select the ratio of the mass of the at least one oxidizable organic compound to the surface area of the silver oxide layer to be provided with the at least one oxidizable organic compound.

For production of the joint contact surfaces, the components are placed, each by their metallic contact surface, onto the corresponding similar oxide surfaces of the silver sintering agent that are provided with the at least one oxidizable organic compound. The region of overlap of the metallic contact surfaces or surface fractions thereof and the corresponding silver oxide surface defines the joint contact surface in this context.

Finally, the arrangement of the at least two components and the silver sintering agent situated in between them, which comprises the silver oxide surfaces provided with the at least one oxidizable organic compound, is subjected to a pressure sintering process.

The actual pressure sintering takes place at an object temperature of, for example, 200 to 280° C. and the process pressure is in the range of, for example, 1 to less than 40 MPa, preferably 5 to 20 MPa. The sintering time is in the range of, for example, 1 to 5 minutes.

If the procedure follows embodiment (II) of the method exclusively, the pressure sintering can take place in an atmosphere that is not subject to any special restrictions except that it is different from the atmosphere prevailing in embodiment (I). For example, an atmosphere containing oxygen or an oxygen-free atmosphere can prevail in embodiment (II). In the scope of the invention, an oxygen-free atmosphere shall be understood to mean an atmosphere, in particular an inert gas atmosphere, for example of nitrogen and/or argon, whose oxygen content is no more than 500 ppm, preferably no more than 10 ppm, and even more preferably no more than 1 ppm.

The pressure sintering takes place in a conventional apparatus that is suitable for pressure sintering, in which the above-mentioned process parameters can be set.

Exemplary Embodiment and Application Example 1

Stencil printing was used to apply a layer of a silver sintering paste (ASP 043-04P2 from Heraeus Materials Technology) sized 10×10 mm² onto a support substrate in the form of a polytetrafluoroethylene film at a wet layer thickness of 100 µm, which was then sintered for 30 min in a circulating-air drying cabinet at an object temperature of 250° C.

The sintered product was carefully detached from the support substrate using a suction pipette to obtain a free layer-shaped silver sintering body.

A 10 wt % aqueous sodium carbonate solution was placed in a stainless steel vessel and the stainless steel vessel was connected to the cathode of a 10 V direct voltage source. The anode of the voltage source was connected to the free layer-shaped silver sintering body and the latter was then immersed in the sodium carbonate solution for 30 seconds.

Once it was taken out, the blackened surface of the free layer-shaped silver sintering body resulting from anodic oxidation was rinsed with deionized water and then dried. Subsequently, one droplet of a 2 wt. % lauric acid solution in Exxsol D60 was placed on the silver oxide surfaces on the front and rear side, distributed evenly, and dried in a circulating-air heating cabinet at 70° C. Then the silver sintering body thus provided with lauric acid was joined between the gold surface of a corresponding DCB substrate and the silver contact surface of an IGBT sized 10×10 mm² and the sandwich arrangement thus produced was sintered in a sintering press for 120 seconds at an object temperature of 250° C. and a mechanical pressure of 20 MPa.

After the sintering, the bonding was determined by testing the shear strength. In this context, the components were sheared off with a shearing chisel at a rate of 0.3 mm/s at 20° C. The force was measured by means of a load cell (PAGE 2000 device made by DAGE, Germany). The result obtained with Example 1 is shown in Table 1.

TABLE 1

| Example | 1 |
| --- | --- |
| Shear strength (N/mm²) | 31 |

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for producing a silver sintering agent in the form of a discrete layer-shaped silver sintering body having external silver oxide surfaces, the method comprising:
   (1) applying a silver sintering preparation onto a support substrate having a surface that is incapable of forming a sintered connection;
   (2) sintering the applied silver sintering preparation to form a layer-shaped silver sintering body; and
   (3) detaching the layer-shaped silver sintering body formed in step (2) from the surface of the support substrate to form a discrete layer-shaped silver sintering body, wherein the silver sintering body contains no silver oxide in its mass other than the external silver oxide surfaces.

2. The method according to claim 1, further comprising:
   (4) producing or reinforcing a silver oxide layer on at least a part of the external surface of the discrete layer-shaped silver sintering body by an oxidation step after step (3).

3. The method according to claim 1, wherein the layer-shaped silver sintering body has a layer thickness in a range of 10 to 300 μm.

4. The method according to claim 1, wherein the support substrate having a surface that is incapable of forming a sintered connection is selected from the group consisting of aluminum oxide ceramics, nickel foils, polyimide films, polytetrafluoroethylene films, and silicone films.

5. The method according to claim 1, wherein the silver sintering agent is present as endless ware.

6. The method according to claim 1, wherein the silver sintering agent comprises a front side comprising a silver oxide surface and a rear side comprising a silver oxide surface.

7. The method according to claim 1, wherein the silver oxide layer or silver oxide surface is formed by contact with air or is produced or reinforced chemically by oxidation agents or by anodic oxidation.

* * * * *